US006777274B2

(12) United States Patent
Moon et al.

(10) Patent No.: US 6,777,274 B2
(45) Date of Patent: Aug. 17, 2004

(54) LOW TEMPERATURE POLYCRYSTALLINE SILICON TYPE THIN FILM TRANSISTOR AND A METHOD OF THE THIN FILM TRANSISTOR FABRICATION

(75) Inventors: Kook-Chul Moon, Yongin-shi (KR); Hyun-Dae Kim, Yongin-shi (KR); Hoon-Kee Min, Yongin-shi (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/571,008

(22) Filed: May 15, 2000

(65) Prior Publication Data

US 2002/0137266 A1 Sep. 26, 2002

(30) Foreign Application Priority Data

Jan. 25, 2000 (KR) ........................................ 2000-03467
Apr. 29, 2000 (KR) ........................................ 2000-23111

(51) Int. Cl.[7] .............................................. H01L 21/84
(52) U.S. Cl. ........................................ 438/166; 438/770
(58) Field of Search ................................. 438/151–166, 438/770

(56) References Cited

U.S. PATENT DOCUMENTS

| | | | | |
|---|---|---|---|---|
| 5,372,958 A | * | 12/1994 | Miyasaka et al. | 438/486 |
| 5,869,362 A | * | 2/1999 | Ohtani | 438/166 |
| 5,946,561 A | * | 8/1999 | Yamazaki et al. | 438/166 |
| 5,994,172 A | * | 11/1999 | Ohtani et al. | 438/151 |
| 6,140,166 A | * | 10/2000 | Ohtani et al. | 438/166 |
| 6,168,980 B1 | * | 1/2001 | Yamazaki et al. | 438/162 |
| 6,171,890 B1 | * | 1/2001 | Adachi et al. | 438/162 |

* cited by examiner

*Primary Examiner*—Richard A. Booth
(74) *Attorney, Agent, or Firm*—McGuireWoods, LLP

(57) ABSTRACT

A method of fabricating poly crystalline silicon type thin film transistor is disclosed. In the method, before the step of re-crystallization of amorphous silicon to form polycrystalline silicon active pattern, a step for injecting predetermined amount of oxygen atom into the surface part of the amorphous silicon layer. By this addition of step, the surface part of the silicon layer is to be oxidized and the crystal defect in the interface between the gate insulating layer and poly crystalline silicon layer can be cured and the mobility of charge carrier can be improved in the channel of the thin film transistor.

14 Claims, 4 Drawing Sheets

LOW TEMPERATURE POLYCRYSTALLINE SILICON TYPE THIN FILM TRANSISTOR AND A METHOD OF THE THIN FILM TRANSISTOR FABRICATION

This application relies for priority upon Korean Patent Application No. 2000-03467, filed on Jan. 25, 2000 and No. 2000-23111, filed on Apr. 29, 2000, the contents of which are herein incorporated by reference in their entirety.

FIELD OF THE INVENTION

The present invention relates generally to a low temperature polycrystalline silicon type thin film transistor and a method of fabricating the thin film transistor, and is directed more particularly to the thin film transistor which can increase the mobility of charge carrier and the method of fabricating the thin film transistor.

BACKGROUND OF THE INVENTION

Thin film transistor used in LCD(Liquid Crystal Display) can be divided into two types, amorphous silicon type and polycrystalline silicon type, by material structure of silicon thin film.

In considering that the glass substrate used in LCD panel cannot sustain the flat state in high temperature process, the amorphous silicon type thin film transistor is more favorable for LCD fabrication because the amorphous silicon thin film can be formed by a low temperature process, like a CVD (Chemical Vapour Deposition) process under the temperature of 400° C.

But, in amorphous silicon, the mobility of charge carrier is lower than that in polycrystalline silicon. And the rapid operation of transistor is needed for integrated circuits used in driving LCD. Thus, the integrated circuits cannot be formed on the amorphous silicon thin film of which the active region of pixel transistor of LCD is made. And thus, the integrated circuits should be prepared independently and attached to the peripheral part of LCD panel to drive the pixel transistors of LCD.

On the other hand, in the polycrystalline silicon type thin film transistor, the mobility of charge carrier is far higher than the mobility of charge carrier in an amorphous silicon type thin film transistor. Thus, the transistor formed on the polycrystalline silicon thin film can be adapted in an integrated circuit for driving LCD. And that means the integrated circuit for driving LCD can be formed on the polycrystalline silicon thin film formed on a substrate of LCD panel. Resultantly, in the LCD of polycrystalline silicon type thin film transistor, power consumption of LCD and expense of fabricating LCD can be lowered.

But, in case of adapting polycrystalline silicon type thin film transistor, the additional process of laser beam scanning to crystallize the primal amorphous silicon film formed by low temperature CVD is needed. And, the fact that driving integrated circuit generally has both p type channel transistor and n type channel transistor makes the process of forming transistors of driving integrated circuit and the process of forming LCD more complicated.

Polycrystalline silicon type thin film transistor can also be compared with mono crystalline silicon type transistor which is formed on mono crystal silicon wafer. In comparison with mono crystalline silicon, the polycrystalline silicon has much more grain surface and thus has much more defects like dangling bonds. Accordingly, in a polycrystalline silicon type thin film transistor, the interface between polycrystalline silicon and gate oxide has much more crystal defects. These defects decrease the average mobility of charge carrier in the channel of polycrystalline silicon type thin film transistor by capturing the charge carrier when the source/drain current flows. Thus, the defects lower the speed of operation in the transistor. To improve the speed of operation of polycrystalline silicon type thin film transistor and to improve the quality of LCD, the decrease of the mobility of charge carrier in polycrystalline silicon should be avoided.

The crystal defect occurs at the point of destroyed crystal bond. In the region of crystal defect, the regularity of crystal is destroyed and some electrons of the atoms of defected area are released from the covalent bond of crystal and remain alone. Therefore, on the surface of crystal grain and in the interface between the crystal and other materials, there are a lot of single electrons having a strong tendency of making bond with electrons of other atoms or free electrons as charge carriers to be pair. Thus, in the channel region of polycrystalline silicon type thin film transistor, a considerable amount of charge carrier electrons is to be captured during the operation of the transistor and that lowers the conductivity of channel and the speed of operation of the transistor.

To get rid of the charge carrier trap, the crystal defect, of polycrystalline silicon type thin film transistor, the method of containing hydrogen in the polycrystalline silicon is used. The method of containing hydrogen in amorphous silicon and crystallizing amorphous silicon is also used. By these method, the hydrogen atom donate the electron it possesses and makes covalent bond with single state electron of silicon atom in the defect point and the defect point can be cured. And the field effective mobility can be recovered.

But, the silicon-hydrogen bond made in these method of containing hydrogen in the polycrystalline or amorphous silicon has low bond energy. So, the bond can be easily dissolved and the hydrogen is volatilized in a process of high temperature like laser scanning which is for amorphous silicon crystallization and is done at the temperature about 300° C. Furthermore, as the time pass, the number of silicon-hydrogen bond decrease and the occurrence of charge carrier electron capturing increase in the transistor. This is caused by the fact that the heat generated during the operation of polycrystalline silicon type thin film transistor stimulate the hydrogen atoms to have the tendency of being volatilized. And this naturally lowers the reliability of integrated circuit device having the polycrystalline silicon thin film transistor. Above-mentioned weakness of polycrystalline silicon type thin film transistor is well described in the following thesis.

(I. W. Wu, W. B. Jackoson, T. Y. Huang, A. G. Lewis and A. Ciang, "Mechanism of device degradation in n- and p-channel TFTs by electrical stressing", IEEE Electron Device Lett, vol.12, p.181, April 1991: I. W. Wu, W. B. Jackoson, T. Y. Huang, A. G. Lewis and A. Ciang, "Passivation kinetics of two types of defects in polysilicon TFT by plasma hydrogenation", IEEE Electron Device Lett, vol.11, p.167, April 1990)

OBJECTS AND SUMMARY OF THE INVENTION

Accordingly, an object of the present invention is to provide a polycrystalline silicon type thin film transistor and a method of fabricating the thin film transistor to diminish the problems generated from the dangling bond in the channel region of thin film transistor.

It is other object of the present invention to provide a polycrystalline silicon type thin film transistor improved in the carrier mobility in the channel region of thin film transistor and thus improved in the speed of operation of thin film transistor.

It is another object of the present invention to provide a polycrystalline silicon type thin film transistor improved in the value of threshold swing in a thin film transistor.

According to the present invention there is provided with a top gate type polycrystalline silicon thin film transistor in which the thickness of the oxidized amorphous layer where the concentration of oxygen atom equal to or exceed $10^{20}$ atoms/cm$^3$ under CVD gate oxide layer is in the range of 10 Å~100 Å. And in the other level of oxygen concentration, the top gate type polycrystalline silicon thin film transistor of the present invention can be characterized in that the oxygen atom concentration at the spot of 20 Å below the CVD gate oxide of the channel region is more than $3*10^{20}$ atoms/cm$^3$ or in that the oxygen atom concentration at the spot of 40 Å below the CVD gate oxide of the channel region is more than $10^{20}$ atoms/cm$^3$ by ultra low energy SIMS (Second Ion Mass Spectroscopy).

According to the present invention there is also provided with a method of fabricating a thin film transistor characterized by the step of oxidizing the surface of an amorphous silicon layer. The oxidizing step usually lies between the step of forming the amorphous silicon layer by low temperature CVD and the step of re-crystallizing of the amorphous silicon layer having the oxidized surface by laser beam scanning. The step of oxidizing the amorphous silicon layer may be lie next the step of re-crystallizing.

Referring to the specific method for oxidizing the amorphous silicon layer, the method of spontaneous diffusion and the method of forced injection can be used. The method of spontaneous diffusion can be done by placing the substrate deposited with amorphous silicon layer in clean air condition or oxygen gas during a predetermined time period of more than 6 hours or more preferably 24 hours. The method of forced injection can be done by the steps of supplying gases including oxygen atom in process chamber, generating plasma including oxygen atom or radicals by resolving the gases and injecting the oxygen atom or radicals into amorphous silicon layer. In the plasma type oxidation, the RIE (reactive ion etching) method is not considered because the peak value of oxygen concentration is shown far below the surface and only the surface layer of 100 Å is in our concern. The method of forced injection can also be done by heating the substrate up to the temperature about 300° C. and increasing the speed of diffusion of oxygen atom into the amorphous silicon layer.

In the present invention, the method for oxidizing the amorphous silicon layer may well be executed so that the thickness of the oxidized amorphous layer where the concentration of oxygen atom equal to or exceed $10^{20}$ atoms/cm$^3$ is in the range from 20 Å to 100 Å. In a lower level of oxygen concentration, the oxidizing step can be executed until the oxygen atom concentration at the position of 40 Å below the surface of the oxidized amorphous silicon exceed $3*10^{20}$ atoms/cm$^3$ by ultra low energy SIMS(Second Ion Mass Spectroscopy).

The other objects, features and advantages of the present invention will become apparent from the following description taken in conjunction with the accompanying drawings.

DESCRIPTION OF THE PREFERRED EMBODIMENT

Hereinbelow, a few embodiment of the top gate type polycrystalline silicon thin film transistor and a few embodiment of the method of forming the thin film transistor according to the present invention will be described.

Figure 1:
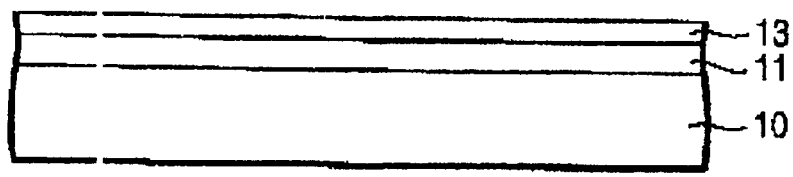
FIG. 1 to FIG. 3 are cross sectional views showing each steps comprised in the process of the present invention.

Referring to FIG. 1, on the glass substrate(10), a blocking layer(11) is formed with silicon nitride and an amorphous silicon layer(13) is deposited on the blocking layer(11). The amorphous silicon layer(13) is formed by low temperature CVD under the temperature of 400° C.

Figure 2:
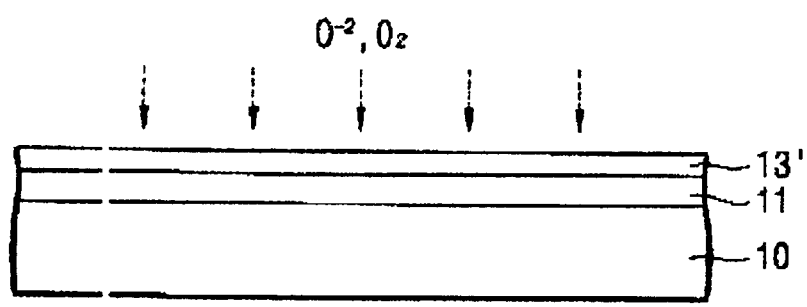
Figure 5:
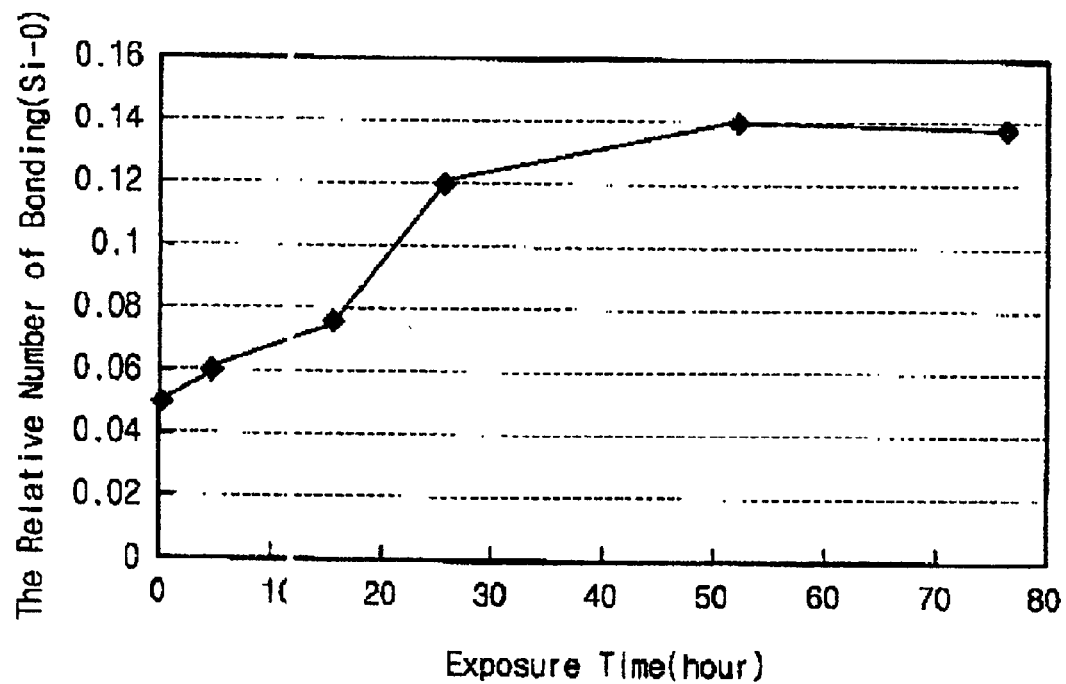
FIG. 5 is a graph showing the trend of the respective change of the number of silicon-oxygen bond measured by FT-IR in the amorphous silicon with the time pass in case the amorphous silicon layer is exposed in air or oxygen gas during the predetermine time.
Figure 6:
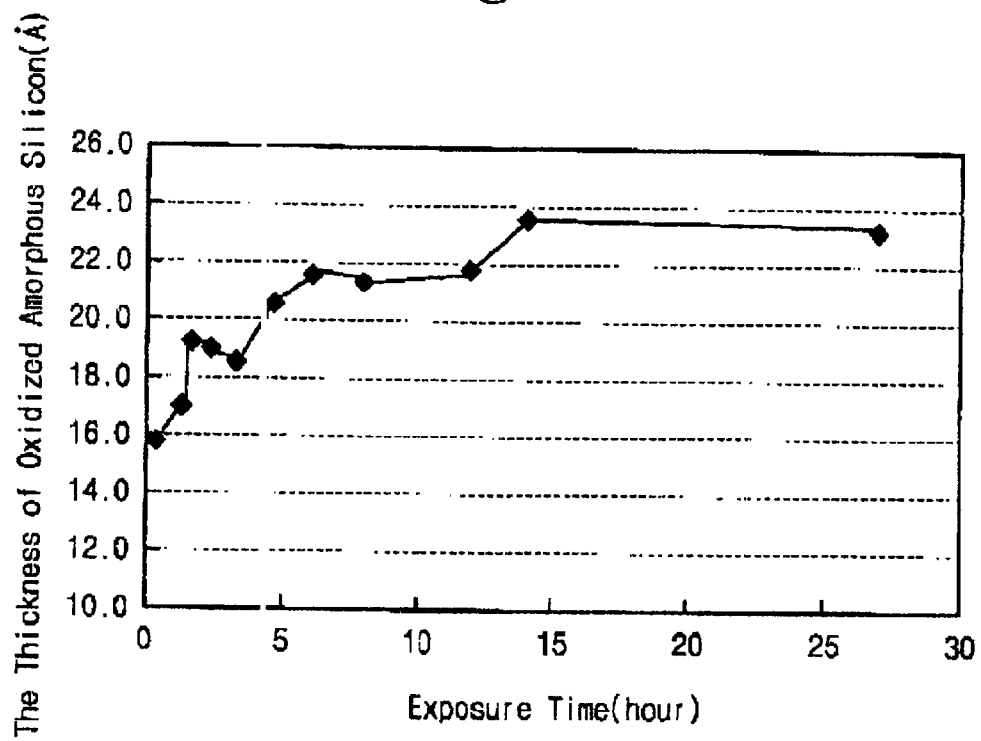
FIG. 6 is a graph showing the trend of the respective change of the thickness of nature oxide at the surface of amorphous silicon layer measured by ellipsometer spectroscopy with the time pass in case the nature oxide is formed under the same condition mentioned in the description of FIG. 5.

Referring to FIG. 2, the substrate(10) deposited with amorphous silicon layer(13) is exposed to clean air or oxygen gas for at least 6 hours or more favorably 24 hours. in the mean time, oxygen atoms are diffused into the amorphous silicon layer(13') and make loose bond with silicon atom and form a nature oxide layer at the surface of the amorphous silicon layer(13'). As the time pass, the number of silicon-oxygen bond increase but with decreasing ratio and finally stop the increase and that means the surface layer of the amorphous silicon layer(13') is saturated with oxygen atom. FIG. 5 is the graph showing the trend of the respective change of the number of silicon-oxygen bond measured by FT-IR in the amorphous silicon. FIG. 6 is a graph showing the trend of the respective change of the thickness of nature oxide at the surface of amorphous silicon layer measured by ellipsometer spectroscopy.

In a thin film transistor, polycrystalline silicon layer forms channel. And the most important role of the channel, the role as a path of electric current, is done by the thin crust of 100 Å of polycrystalline layer in channel region, So the boundary of cure for crystal defect including dangling bond may well be restricted to the upper part of 100 Å of polycrystalline silicon layer. The proper concentration of oxygen in the polycrystalline silicon layer is to be acquired by containing oxygen atom in the amorphous silicon layer through the surface at least until the oxygen atom concentration at the spot of 20 Å below the surface of oxidized amorphous silicon of channel region is more than $3*10^{20}$ atoms/cm$^3$ by the measurement of ultra low energy SIMS(Second Ion Mass Spectroscopy).

The specific time of exposure of amorphous silicon in the air, 6 hours, is decided as a saturation point of oxygen atom in amorphous silicon by the graph in the FIG. 6 acquired by accurate experiment. And the specific time is suggested to have realistic effect in charge mobility. By the careful examination of the FIG. 6 and FIG. 7, the 6 hour is corresponding to the time during which the 20 Å-thick nature silicon dioxide can be formed in the normal air under the premise that the concentration of oxygen atom in silicon dioxide insulation layer is more than $10^{21}$ atoms/cm$^3$ by the measurement of ultra low energy secondary ion mass spectroscopy. If the thickness of silicon dioxide is smaller than 20 Å, the effect of curing the defect is uncertain. And, considering that some of the oxide layer can be removed by volatilization caused by the laser beam, thickness of oxide of more than 20 Å is needed to secure the cured region. But, at the same time, considering that too thick silicon dioxide layer do harm for the precise re crystallization of the amorphous silicon layer, the thickness of the silicon dioxide may well be confined under 100 Å. Usually, there is no need to oxidize the surface of the amorphous silicon layer to 100 Å and it is enough to obtain the effect of the present invention to execute the oxidation until the oxygen atom concentration at the position of 40 Å below the surface of the oxidized amorphous silicon exceed $10^{20}$ atoms/cm$^3$.

The oxygen can be contained in amorphous silicon by exposing the substrate in plasma condition. In the plasma condition, the activity of oxygen radicals can be promoted and thus the dealing time to injecting oxygen atom into amorphous silicon must be shortened considerably. And, in case of exposing the substrate in plasma condition, the oxygen radicals can be accelerated and injected into amorphous silicon with some energy. So, the maximum concentration point of oxygen may lie at some distance, for example 20~40 Å from the surface of the original amorphous silicon layer.

High temperature also can elevate the diffusion of oxygen atom into amorphous silicon layer. So, if the substrate having amorphous silicon layer is transferred to be exposed to air or oxygen gas from the CVD chamber of 300° C. as soon as the amorphous silicon layer is formed, the process time for containing proper amount of oxygen atom in the amorphous silicon can be shortened by the residual heat.

If the amorphous silicon layer is formed in an PECVD (plasma enhanced CVD) process chamber, gases including oxygen atom may be supplied into the chamber in-situ and process of forming oxygen plasma and injection of oxygen atom in to amorphous silicon may be done at the same temperature of CVD process.

Figure 3:
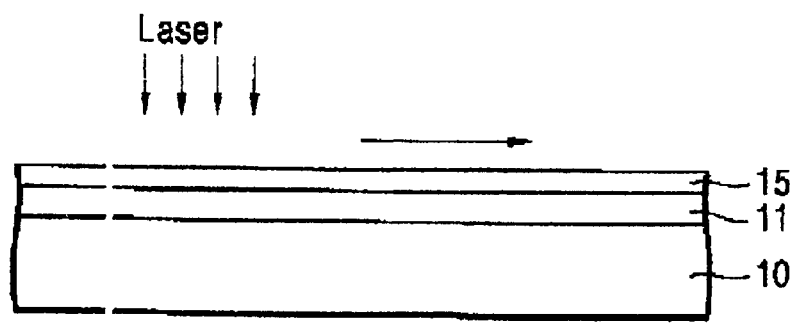

Referring to FIG. 3, on the amorphous silicon layer, the laser beam scanning is made at the spot of laser beam in the process of the scanning, the amorphous silicon is re-crystallized and transformed into polycrystalline silicon layer(15) by the heat generated from the laser beam. When the re crystallization of the amorphous silicon is made, the oxygen atoms contained in the amorphous silicon, in the oxidized silicon and in the interface of silicon with the oxidized silicon, bonded loosely to silicon atoms are decomposed from the silicon atoms. And then the separated oxygen atoms make stronger bond with silicon atoms of the crystal defect in the interface region between the oxidized silicon layer and the polycrystallized silicon by the high thermal energy caused by laser beam. Resultantly, considerable part of crystal defect in the interface region can be cured by the compensatory supplement of oxygen atom to the dangling bond of silicon.

In a general oxidation of silicon process for semiconductor integrated circuit, by the high thermal energy, oxygen atoms in the air penetrate the silicon dioxide layer ready made during the oxidation process and react with silicon to form a thicker silicon dioxide layer. But, in the present invention, the process of bonding between silicon and oxygen is divided into two sub steps. In other words, in the suggested step of containing oxygen into amorphous silicon, a small amount of oxygen is introduced in the amorphous silicon before the re crystallization is made. At this time, the weak bond between the silicon atom and oxygen atoms is made. And in the step of the re crystallization, the introduced oxygen is supplied at the point of crystal defect on the surface of polycrystalline silicon grain especially in the interface of polycrystallized silicon with the oxidized silicon. At this time, the bond between oxygen and silicon is stronger and make a stable state.

In the process of laser beam scanning, the temperature level of substrate macroscopically should be sustained below 300 or 400° C. Above the temperature, the flatness of the substrate may be damaged. but the temperature of silicon should excess the re-crystallization temperature. so, the influence of the laser beam should be temporal and restricted in a very small region of amorphous silicon layer comparable to the beam spot. practically, by controlling the speed of beam scanning, the temperature of substrate can be controlled and for example, in beam spot scale, the temperature of silicon higher than 900° C. can be obtained and continued for shorter time than 1 micro sec without influencing the flatness of substrate.

Figure 4:
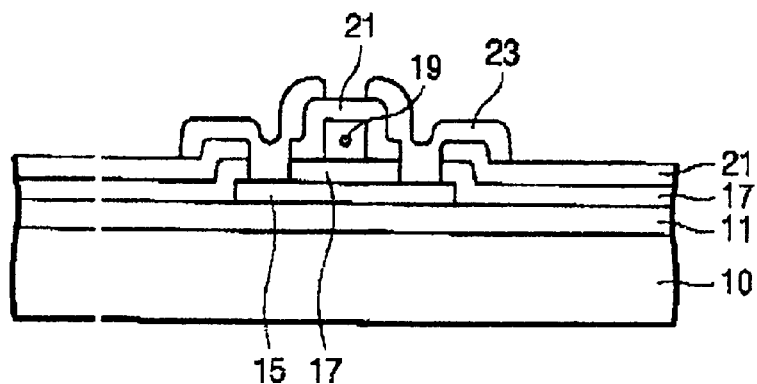
FIG. 4 is cross sectional view showing the structure of thin film transistor in a pixel of top gate type polycrystalline silicon thin film transistor LCD.

FIG. 4 shows the structure of the present invention, thin film transistor in a pixel of top gate type thin film transistor LCD.

According to FIG. 4, a blocking layer(11) lies on a substrate(10). On the blocking layer(11) made of silicon dioxide, polycrystalline silicon pattern(15) is formed. the pattern(15) corresponds to active region of pixel of an LCD. on the substrate(10) having the pattern(15), gate insulation layer(17) is formed. and a gate pattern(19) is formed on the gate insulation layer(17). gate insulation layer(17) is mostly made of silicon dioxide and formed by CVD process. the gate pattern(19) includes the gate electrode of each pixel and gate signal line not shown. over the gate pattern(19), inter layer insulation layer(21) is laid. at the both sides of the gate pattern(19), electrodes(23) are formed. the electrodes(23) meet the polycrystalline silicon pattern(15) at source/drain region through the holes formed in the gate insulation layer(17) and inter layer insulation layer(21). one of the electrodes(23) is to be connected with data line and the other to be connected with pixel electrode directly or by contact hole formed in a protection layer in the LCD.

In the thin film transistor, the polycrystalline silicon pattern(15) is mostly doped with p type or n type impurities by an ion implanting process. in the implanting process, the gate pattern(19) makes a role as an ion implanting mask. And, before the gate insulation layer(17) is covered over the polycrystalline silicon pattern(15) and before an amorphous silicon is transformed to a polycrystalline silicon layer, the amorphous silicon layer is exposed to gas or plasma having oxygen atom or oxygen radicals. So, in the thin film transistor, the concentration of oxygen at the point of 40 Å below the gate insulation layer(17) is to be more than $10^{20}$ atoms/cm$^3$ by the measurement of ultra low energy secondary ion mass spectroscopy. And in the thin film transistor of the present invention, it may well be said that the concentration of oxygen at the point of 20 Å below the gate insulation layer(17) in the channel is more than $3*10^{20}$ atoms/cm$^3$ by the measurement of ultra low energy Second Ion Mass Spectroscopy.

Especially, in case the injection of oxygen is made in a plasma environment, the thin film transistor of the present invention can be characterized by the fact that the point of maximum concentration of oxygen in the channel lies at least 5 Å below the gate insulation layer(17) made by CVD process. The above mentioned specific value, 5 Å, can be acquired by considering the fact that the maximum concentration of oxygen usually is shown at the point of about 20 Å from the surface of the original amorphous silicon layer.

Figure 7:
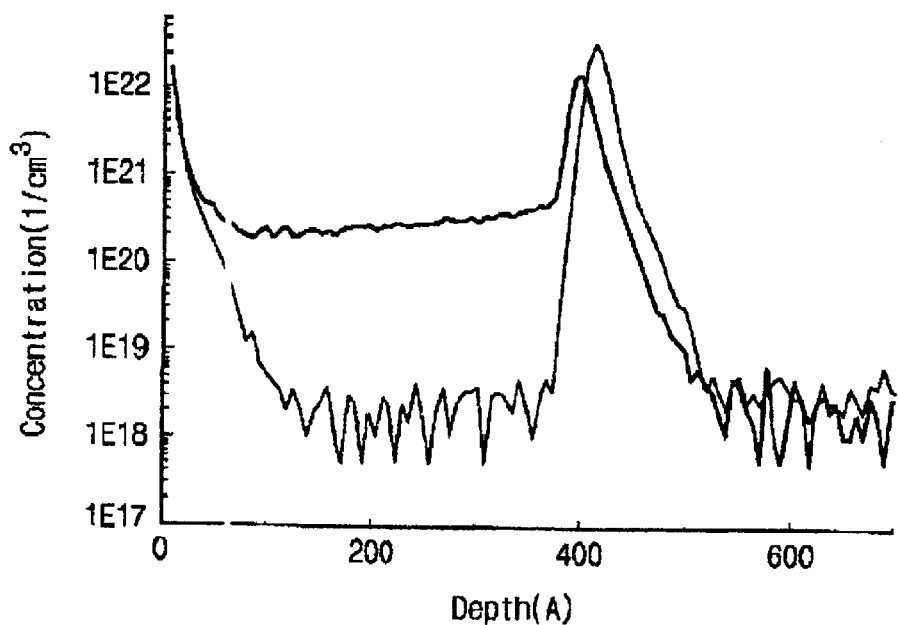
FIG. 7 is a graph showing the oxygen concentrations in amorphous silicon layers each of which are manipulated by the two embodiments of present invention. The front part of 400 Å of the depth axis is placed to assist the measurement and should not be counted in the decision of concentration to the depth of polycrystalline silicon.

In a thin film transistor of the present invention, for the decision of the specific values which is to characterize the present invention, the examination for the graph in FIG. 7. is needed. Most of the above mentioned values can be acquired by the careful examination of graph in FIG. 7. It should also be notified that some of the oxidized amorphous silicon layer made from the original amorphous silicon layer is to be removed in the cleaning step following the re crystallization step.

The difference of the above mentioned two values, 20 Å and 5 Å, can be explained by the fact that some of the oxidized amorphous silicon layer made from the original amorphous silicon layer is removed in the cleaning step following the re-crystallization step. In most cases the thickness removed in the cleaning process is in the range of 10~20 Å. For the cleaning process, diluted fluoric acid is generally used and acts as a weak etchant to the oxidized layer. Ideally, in this case, to the point of maximum concentration from the surface of the oxidized amorphous silicon, the concentration of oxygen should increase, But the distribution of the oxygen concentration is influenced by the following steps like CVD for gate insulation layer and some thermal steps so that the resultant concentration of oxygen may show a horizontal line. The horizontal line means the concentration is sustained at a level for the corresponding region.

Figure 8:
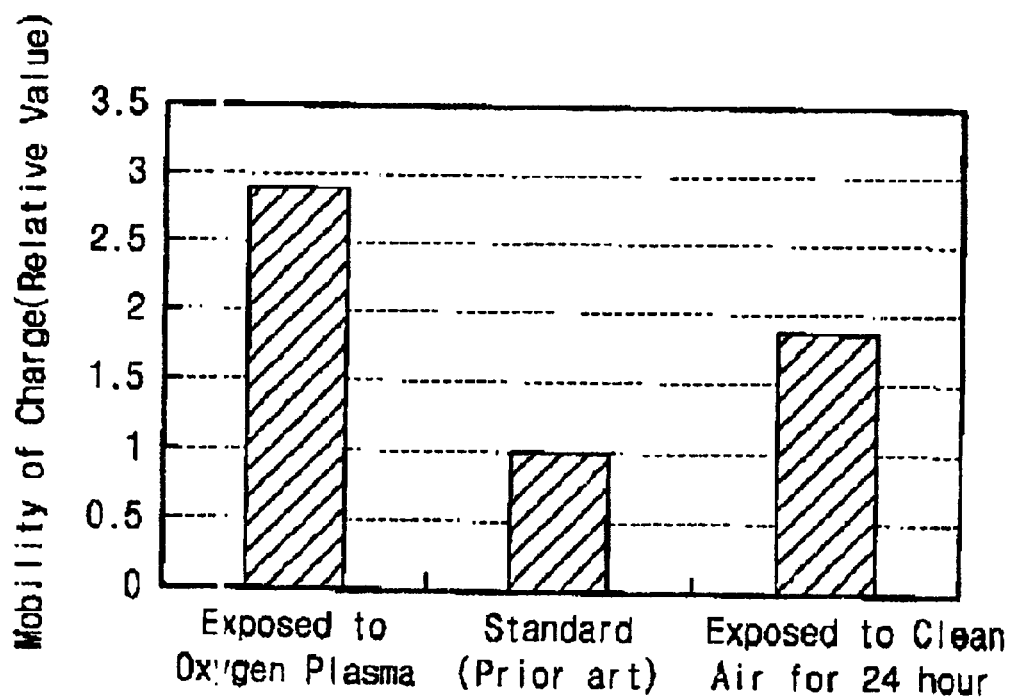
FIG. 8 is a graph showing the respective magnitudes of carrier mobility in polycrystalline silicons formed by some embodiments of the present invention compared to the unit magnitude of the carrier mobility of prior art.

Referring to FIG. 8, the mobility of electric charge in a thin film transistor of the present invention is improved by 80% for the case exposed to clean air for 24 hours and improved by 180% for the case exposed to oxygen plasma compared to the mobility in the prior art in which no intended exposure to oxygen is made. In the graph, because the absolute value of the mobility fluctuate seriously according to the environmental conditions, the absolute value is not presented and only the relative value for the mobility is presented.

Resultantly, the sub-threshold swing which can be the measure of the speed of transistor operation improved by above 10%. The value of threshold swing means the increase of electric potential difference between gate and source (Vgs) corresponding to the change of source-drain current from 10-8 ampere to 10-7 ampere in a transistor.

The value can be presented by the following equation.

$$\text{threshold swing} = d(Vgs)/d(\log Isd)$$

where the Vgs is the electric potential difference between gate and source, the Isd is the current through the channel between source and drain and changes from 10-8 ampere to 10-7 ampere.

In a thin film transistor of prior art, the value of the threshold swing is generally in the range of 0.3 and 0.4. But, according to the present invention, the value can be improved to the value under 0.25 and mostly lies in the range from 0.21 to 0.23. The improvement is so prominent that in case the improved value may be recognized as a characteristics of the present invention. The change of threshold voltage in a thin film transistor of the present invention remains stable in a extreme test condition (gate voltage Vg=3MV/cm, temperature T=300K, electric potential difference between source and drain Vsd=0.1V, operating time: 10 min.). The stability can be acquired by the strong bond between silicon and oxygen which prevent the decomposition of oxygen from the surface region of polycrystalline silicon layer.

The specific values used for characterizing the present invention should be applied to the process of fabrication. And to improve the reliability, the specific values may be shrunken according to the needed reliability.

While the invention has been described in terms of its preferred embodiments, those skilled in the art will recognize that the invention can be practiced with modification within the spirit and scope of the appended claims.

What is claimed is:

1. A method of fabricating a thin film transistor of a polycrystalline silicon type, comprising the steps of:
   forming an amorphous silicon layer on a substrate;
   oxidizing a surface region of the amorphous silicon layer to form an oxidized silicon surface layer having a thickness in a range of about 20 Å to about 100 Å;
   transforming the amorphous silicon layer and the oxidized silicon surface layer into a polycrystalline silicon layer having the oxidized surface region, wherein the step of transforming comprises the steps of:
   separating oxygen atoms contained in the amorphous silicon layer, the oxidized silicon surface layer, and an interface region therebetween, and
   bonding the separated oxygen atoms with silicon atoms in the amorphous silicon layer to cure crystal defects in the interface region;
   forming a gate insulation layer on the oxidized surface region; and
   forming a gate electrode on the gate insulation layer.

2. The method of claim 1, wherein the step of transforming the amorphous silicon comprises the step of laser annealing.

3. The method of claim 1, wherein said oxidized silicon surface layer has an oxygen atom concentration of about $10^{20}$ atoms/cm$^3$ or greater by measurement of ultra low energy secondary ion mess spectroscopy (SIMS).

4. The method of claim 1, wherein the step of oxidizing the surface region comprises the step of exposing the amorphous silicon layer in a clean atmospheric conditions for at least 6 hours.

5. The method of claim 1, wherein the step of oxidizing the surface region comprises the step of exposing the amorphous silicon layer in a oxygen plasma environment including oxygen radicals.

6. The method of claim 1, wherein the step of oxidizing the surface region is continued until the concentration of oxygen atom at the point of 40 Å below the upper surface of the oxidized silicon substrate layer is about $10^{20}$ atoms/cm$^3$ or greater by the measurement of ultra low energy secondary ion mess spectroscopy.

7. The method of claim 2, wherein the step of laser annealing is performed such that a temperature of the amorphous silicon layer at a beam spot is higher than 900° C. for less than 1 micro second while a temperature of the substrate is retained under 400° C.

8. A method of curing crystal defects in a silicon layer, comprising steps of:
   forming an amorphous silicon layer on a substrate, the amorphous silicon having crystal defects in a surface region thereof;

oxidizing the amorphous silicon layer to form an oxide layer at a thickness of about 20 Å to about 100 Å in the surface region of the amorphous silicon to introduce oxygen atoms in the surface region of the amorphous silicon layer, the introduced oxygen atoms forming weak bonds with silicon atoms in the surface regions of the amorphous silicon layer; and laser scanning the amorphous silicon layer to separate the oxygen atoms from the weak bonding with the silicon atoms and bond the separated oxygen atoms with the silicon atoms of the crystal defects.

9. The method of claim 8, wherein the step of oxidizing the amorphous silicon layer is performed for a predetermined time such that the oxide layer has oxygen concentration of at least about $1 \times 10^{20}$ atoms/cm$^3$ at a point of 40 Å below from a surface of the oxide layer.

10. The method of claim 8, wherein the step of oxidizing the amorphous silicon layer comprises a step of exposing the amorphous silicon in air or oxygen gas for a predetermined period of time.

11. The method of claim 10, wherein the predetermined period of time is at least six hours.

12. The method of claim 8, wherein the step of oxidizing the amorphous silicon layer comprises a step of exposing the amorphous silicon layer in an oxygen plasma environment including oxygen radicals.

13. The method of claim 8, wherein the amorphous silicon layer is crystallized during the step of laser scanning.

14. The method of claim 13, wherein the step of laser scanning is performed at a temperature higher than 900° C. at a beam spot for less than 1 micro second while the substrate is retained at a temperature lower than 400° C.

* * * * *